(12) United States Patent
Kim et al.

(10) Patent No.: US 10,930,885 B2
(45) Date of Patent: *Feb. 23, 2021

(54) DISPLAY DEVICE

(71) Applicant: SAMSUNG DISPLAY CO., LTD., Yongin-si (KR)

(72) Inventors: Seunghun Kim, Yongin-si (KR); Sooyoun Kim, Yongin-si (KR); Wooyong Sung, Yongin-si (KR); Seungho Yoon, Yongin-si (KR); Moonwon Chang, Yongin-si (KR)

(73) Assignee: SAMSUNG DISPLAY CO., LTD, Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/418,578

(22) Filed: May 21, 2019

(65) Prior Publication Data

US 2020/0006700 A1 Jan. 2, 2020

(30) Foreign Application Priority Data

Jun. 29, 2018 (KR) .................. 10-2018-0075579

(51) Int. Cl.
*H01L 51/52* (2006.01)
*H01L 27/32* (2006.01)
*H01L 51/00* (2006.01)

(52) U.S. Cl.
CPC ...... *H01L 51/5253* (2013.01); *H01L 51/0096* (2013.01); *H01L 51/5237* (2013.01); *H01L 51/5246* (2013.01); *H01L 27/3276* (2013.01)

(58) Field of Classification Search
CPC ... H01L 51/0097; H01L 51/5253–5256; H01L 51/5237–5246; H01L 27/3241–3279; H01L 51/5246
See application file for complete search history.

(56) References Cited

U.S. PATENT DOCUMENTS 8,518,285 B2 * 8/2013 Lee ................. H01L 51/0096
216/24
10,553,819 B2 * 2/2020 Kim ................. H01L 27/3244
(Continued)

FOREIGN PATENT DOCUMENTS

EP 3486962 5/2019
KR 10-2013-0107883 10/2013
(Continued)

OTHER PUBLICATIONS

Extended European Search Report dated Nov. 26, 2019 for Application Serial No. 19183255.9.

*Primary Examiner* — Jose R Diaz
(74) *Attorney, Agent, or Firm* — F. Chau & Associates, LLC

(57) ABSTRACT

A display device includes a substrate, a circuit layer on the substrate, a display layer on the circuit layer, at least one hole in a display area of the substrate that penetrates the substrate, the circuit layer, and the display layer, and at least two grooves that surround the at least one hole, where each of the at least two grooves has an undercut structure. The substrate includes a first substrate, a first inorganic layer, a second substrate, and a second inorganic layer, which are sequentially stacked, and each of the at least two grooves extends down from the display layer into the second substrate.

21 Claims, 6 Drawing Sheets

(56) References Cited

U.S. PATENT DOCUMENTS

| | | | |
|---|---|---|---|
| 10,673,020 B2* | 6/2020 | Kim | ................... H01L 27/3258 |
| 2013/0248867 A1 | 9/2013 | Kim et al. | |
| 2016/0204373 A1* | 7/2016 | Park | ................... H01L 27/3246 |
| | | | 257/40 |
| 2017/0031323 A1* | 2/2017 | Kim | ................... H01L 27/3258 |
| 2017/0248810 A1 | 8/2017 | Shibano et al. | |
| 2017/0288004 A1 | 10/2017 | Kim et al. | |
| 2019/0148672 A1 | 5/2019 | Seo et al. | |

FOREIGN PATENT DOCUMENTS

| | | |
|---|---|---|
| KR | 10-2017-0015632 | 2/2017 |
| KR | 10-1766352 | 8/2017 |
| KR | 2017-151280 | 8/2017 |
| KR | 10-2017-0115177 | 10/2017 |

* cited by examiner

DISPLAY DEVICE

CROSS-REFERENCE TO RELATED APPLICATION

This application claims priority under 35 U.S.C. § 119 from, and the benefit of, Korean Patent Application No. 10-2018-0075579, filed on Jun. 29, 2018 in the Korean Intellectual Property Office, the contents of which are herein incorporated by reference in their entirety.

BACKGROUND

1. Technical Field

One or more embodiments of the present disclosure are directed to display devices.

2. Discussion of the Related Art

Recently, on the front surfaces of display devices, the display area for displaying an image has been increased in size while physical buttons have been removed. Display devices have been introduced in which a separate member, such as a camera, is located in a display area to increase the size of the display area.

To position a separate member such as a camera in the display area, a groove or a through portion where the separate member is located is formed in the display area. However, the groove or the through portion formed in the display area may serve as a moisture intrusion path through which external moisture intrudes into the display area.

SUMMARY

One or more embodiments include display devices that increase the size of a display area and effectively prevent the intrusion of external moisture through a through portion of the display area.

According to one or more embodiments, a display device includes a substrate, a circuit layer on the substrate, a display layer on the circuit layer, at least one hole in a display area of the substrate that penetrates the substrate, the circuit layer, and the display layer, and at least two grooves that surround the at least one hole, each of the at least two grooves having an undercut structure, in which the substrate includes a first substrate, a first inorganic layer, a second substrate, and a second inorganic layer, which are sequentially stacked, and each of the at least two grooves extends down from the display layer into the second substrate.

The at least two grooves may include a first groove closest to the at least one hole and spaced apart from the at least one hole and a second groove that surrounds the first groove and is spaced apart from the first groove. The first inorganic layer may include a pair of first tips that extend into the first groove, in which the pair of first tips face each other to form the undercut structure. The first inorganic layer may include a pair of second tips that extend into the second groove, in which the pair of second tips face each other to form the undercut structure.

The display device may further include a bridge that connects the pair of second tips to each other along portions of the second groove, where the bridge is integrally formed with the pair of second tips, and the pair of first tips are spaced apart from each other along the entire first groove.

The display device may further include an encapsulation layer that covers the display layer, in which the encapsulation layer may include a first inorganic encapsulation layer, an organic encapsulation layer, and a second inorganic encapsulation layer, which are sequentially stacked, and the first inorganic encapsulation layer may cover bottom surfaces and inner wall surfaces of the first groove and the second groove.

The first inorganic encapsulation layer may cover a lower surface of the bridge.

The organic encapsulation layer may fill the second groove.

The second inorganic encapsulation layer and the first inorganic encapsulation layer may be in contact with each other in the first groove.

The first inorganic encapsulation layer and the second inorganic encapsulation layer may extend to an inner side wall of the at least one hole and may be in contact with a side surface of the substrate.

The circuit layer may include a thin film transistor, and the display layer may include an organic light-emitting diode that is electrically connected to the thin film transistor.

According to one or more embodiments, a display device includes a substrate that includes a first substrate, a first inorganic layer, a second substrate, and a second inorganic layer, which are sequentially stacked, a circuit layer on the substrate, a display layer on the circuit layer, at least one hole in a display area of the substrate that penetrates the substrate, the circuit layer, and the display layer, a first groove and a second groove in the display area of the substrate that surround the at least one hole, and an encapsulation layer that covers the display layer, in which the second groove is spaced apart from and surrounds the first groove, and the encapsulation layer may include an organic encapsulation layer that fills the second groove.

Each of the first groove and the second groove may extend down from the display layer into a portion of the second substrate.

The encapsulation layer may further include a first inorganic encapsulation layer and a second inorganic encapsulation layer respectively disposed below and above the organic encapsulation layer, and the first inorganic encapsulation layer and the second inorganic encapsulation layer may be in contact with each other in the first groove.

The first inorganic layer may include a pair of first tips that extend into the first groove toward each other, and the first inorganic layer may include a pair of second tips that extend into the second groove toward each other.

A width of an upper portion of each of the first groove and the second groove may be less than a width of a lower portion of each of the first groove and the second groove.

The first inorganic layer may further include a bridge that connects the second tips to each other along portions of the second groove, and the first tips are completely spaced apart from each other along the entire first groove.

The first inorganic layer may include a plurality of bridges that connect the second tips to each other, and the plurality of bridges may be spaced apart from each other at regular intervals along the second groove.

The circuit layer may include a thin film transistor, and the display layer may include an organic light-emitting diode that is electrically connected to the thin film transistor.

According to one or more embodiments, a display device includes a substrate that includes a first substrate, a first inorganic layer, a second substrate, and a second inorganic layer, which are sequentially stacked, a circuit layer on the substrate, a display layer on the circuit layer, at least one hole in a display area of the substrate that penetrates the substrate, the circuit layer, and the display layer, and a first groove and a second groove in the display area of the substrate and that surround the at least one hole, in which the first inorganic layer includes a pair of first tips that extend into the first groove toward each other, and the first inorganic layer, comprises a pair of second tips that extend into the second groove toward each other.

Each of the first groove and the second groove may extend from the display layer down into a portion of the second substrate, and the second groove may be spaced apart from and surrounds the first groove.

The display device may further include an encapsulation layer that covers the display layer, in which the encapsulation layer includes an organic encapsulation layer that fills the second groove, a first inorganic encapsulation layer and a second inorganic encapsulation layer respectively disposed below and above the organic encapsulation layer. The first inorganic encapsulation layer and the second inorganic encapsulation layer may be in contact with each other in the first groove.

DETAILED DESCRIPTION

Figure 1:
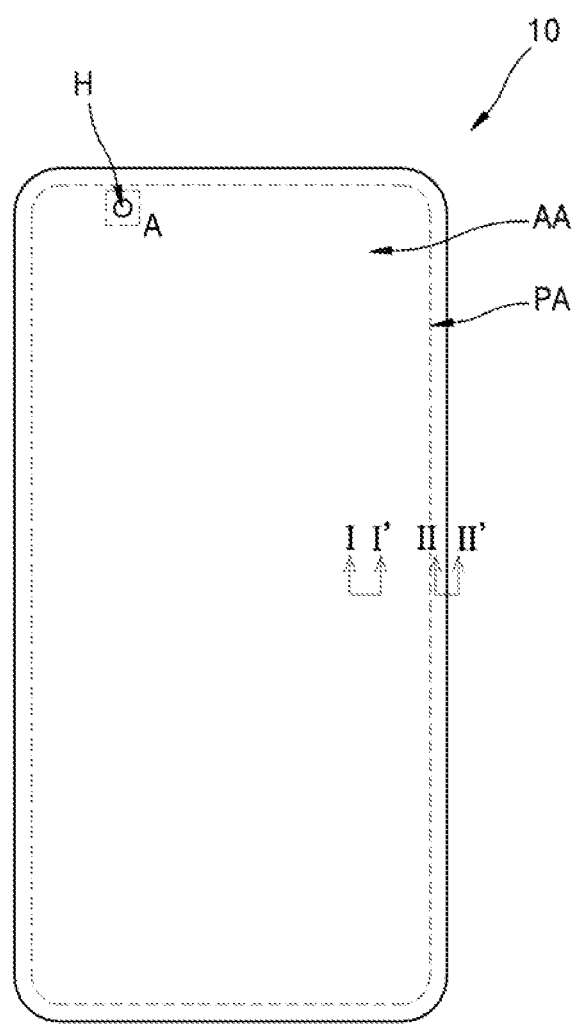
FIG. 1 is a schematic plan view of an exemplary display device according to an embodiment.

As the disclosure allows for various changes and numerous embodiments, embodiments will be illustrated in the drawings and described in detail in the written description. However, this is not intended to limit the present disclosure to particular modes of practice, and it is to be appreciated that all changes, equivalents, and substitutes that do not depart from the spirit and technical scope of embodiments of the present disclosure are encompassed in the present disclosure.

In the following embodiments, it will be understood that when a layer, region, or component is referred to as being "formed on" another layer, region, or component, it can be directly or indirectly formed on the other layer, region, or component.

Sizes of components in the drawings may be exaggerated for convenience of explanation.

Hereinafter, exemplary embodiments of the present disclosure will be described in detail with reference to the attached drawings. Like reference numerals in the drawings may denote like elements.

Figure 2:
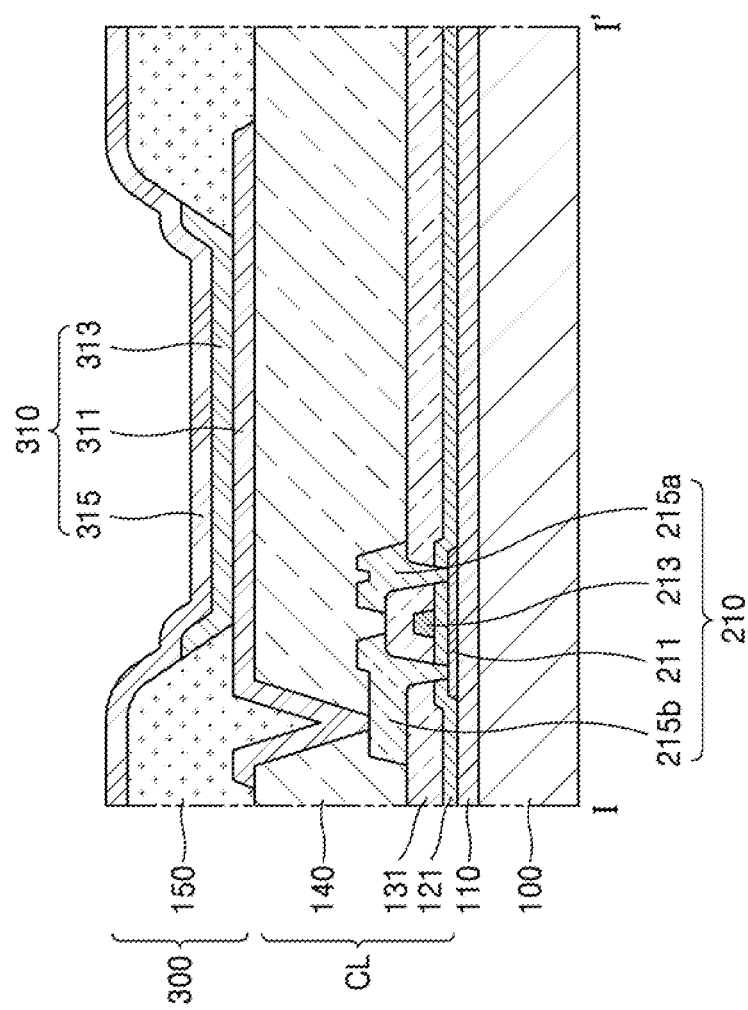
FIG. 2 is a cross-sectional view taken along line I-I' of FIG. 1.

FIG. 1 is a schematic plan view of an exemplary display device 10 according to an embodiment. FIG. 2 is a cross-sectional view taken along line I-I' of FIG. 1.

The display device 10 according to an embodiment includes a substrate 100, a circuit layer CL disposed on the substrate 100 that includes a circuit device such as a thin film transistor 210, and a display layer 300 disposed on the circuit layer CL that includes a display element 310 that is electrically connected to the thin film transistor 210. In a present embodiment, the circuit layer CL includes not only circuit devices such as the thin film transistor 210 or a capacitor, but also various insulating layers formed on the thin film transistor 210. In other words, the circuit layer CL extends from above the substrate 100 to a planarization layer 140. Likewise, the display layer 300 includes the display element 310 and a pixel defining layer 150.

The display device 10 according to an embodiment includes a display area AA where a plurality of pixels are located and a peripheral area PA located outside the display area AA. The substrate 100 includes the display area AA and the peripheral area PA. The peripheral area PA includes a pad area to which various electronic devices or a printed circuit substrate are electrically attached.

According to an embodiment, besides the display element 310, the thin film transistor 210 is located in the display area AA of the substrate 100. FIG. 2 illustrates that an organic light-emitting diode such as the display element 310 is located in the display area AA. The organic light-emitting diode includes a first electrode 311 electrically connected to the thin film transistor 210.

Furthermore, according to an embodiment, at least one through portion H is located in the display area AA. The through portion H is an area that penetrates the substrate 100, the circuit layer CL, and the display layer 300 in a vertical direction, and is a space for a separate component for a function of the display device 10 or to add a new function to the display device 10. For example, the through portion H includes a plurality of through portions formed in the display area AA, and a sensor, a light source, or a camera module is installed in each through portion H, respectively. Since the through portion H penetrates the substrate 100, the circuit layer CL, and the display layer 300, external moisture or oxygen can leak into the display device 10 through the through portion H. However, according to a present embodiment, a plurality of grooves are formed that surround the through portion H, thereby effectively preventing the intrusion of moisture, which is described in detail below with reference to FIG. 4. In the following description, the circuit layer CL and the display layer 300 are described first with reference to FIG. 2.

According to an embodiment, the substrate 100 includes various materials. When an image is displayed in a direction toward the substrate 100, as in a bottom emission type display device, the substrate 100 is formed of a transparent material. However, when an image is displayed in a direction opposite to the substrate 100, as in a top emission type display device, the substrate 100 need not be formed of a transparent material. In this case, the substrate 100 may be formed of a metal. When the substrate 100 is formed of metal, the substrate 100 may include iron, chromium, manganese, nickel, titanium, molybdenum, stainless steel (SUS), an Invar alloy, an Inconel alloy, or a Kovar alloy.

According to an embodiment, a buffer layer 110 is formed on the substrate 100. The buffer layer 110 provides a planarized surface on an upper portion of the substrate 100, and can prevent foreign materials or moisture from diffusing through the substrate 100. For example, the buffer layer 110 may include an inorganic material such as a silicon oxide, a silicon nitride, a silicon oxynitride, an aluminum oxide, an aluminum nitride, a titanium oxide, or a titanium nitride, or an organic material such as polyimide, polyester, or acrylic, and may be formed as a plurality of laminates of the disclosed materials.

According to an embodiment, the thin film transistor 210 and the display element 310 electrically connected to thin film transistor 210 are disposed on the substrate 100.

According to an embodiment, the thin film transistor 210 includes an active layer 211, a gate electrode 213, a source electrode 215a, and a drain electrode 215b. In the following description, a case is described in which the thin film transistor 210 is a top gate type in which the active layer 211, the gate electrode 213, and the source and drain electrodes 215a and 215b are sequentially formed. However, embodiments of the present disclosure are not limited thereto, and various other types of the thin film transistor 210, such as a bottom gate type, may be used.

According to an embodiment, the active layer 211 includes a semiconductor material such as amorphous silicon or polycrystalline silicon. However, embodiments of the present disclosure are not limited thereto, and the active layer 211 may include various other materials. In an exemplary embodiment, the active layer 211 includes an organic semiconductor material, hi another exemplary embodiment, the active layer 211 includes an oxide semiconductor material. For example, the active layer 211 includes an oxide of a material selected from the 12, 13, and 14 group metal elements such as zinc (Zn), indium (In), gallium (Ga), tin (Sn), cadmium (Cd), germanium (Ge), etc., or a combination thereof.

According to an embodiment, a gate insulating layer 121 is formed on the active layer 211. The gate insulating layer 121 may have a single layer or multiple layers formed of an inorganic material such as a silicon oxide or a silicon nitride. The gate insulating layer 121 insulates the active layer 211 from the gate electrode 213. The gate insulating layer 121 is formed not only in the display area AA, but also extends into the peripheral area PA.

According to an embodiment, the gate electrode 213 is formed on the gate insulating layer 121. The gate electrode 213 is connected to a gate line that transmits an on/off signal to the thin film transistor 210.

According to an embodiment, the gate electrode 213 is formed of a low resistance metal. For example, the gate electrode 213 is formed of at least one of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), or copper (Cu), in a single layer or in multiple layers.

According to an embodiment, an interlayer insulating layer 131 is formed on the gate electrode 213. The interlayer insulating layer 131 insulates the source electrode 215a and the drain electrode 215b from the gate electrode 213. The interlayer insulating layer 131 is formed not only in the display area AA, but also extends into the peripheral area PA.

According to an embodiment, the interlayer insulating layer 131 may include a single layer or multiple layers formed of an inorganic material. For example, the inorganic material may be a metal oxide or a metal nitride. In detail, the inorganic material may include a silicon oxide ($SiO_2$), a silicon nitride (SiNx), a silicon oxynitride (SiON), an aluminum oxide ($Al_2O_3$), a titanium oxide ($TiO_2$), a tantalum oxide ($Ta_2O_5$), a hafnium oxide ($HfO_2$), or a zinc oxide ($ZrO_2$).

According to an embodiment, the source electrode 215a and the drain electrode 215b are formed on the interlayer insulating layer 131. The source electrode 215a and the drain electrode 215b contact an area of the active layer 211. The source electrode 215a and the drain electrode 215b are formed of one or more of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), or copper (Cu), in a single layer or in multiple layers. For example, the source electrode 215a and the drain electrode 215b have a stack structure of three layers of titanium (Ti), aluminum (Al), and titanium (Ti).

According to an embodiment, the planarization layer 140 is formed on the source electrode 215a and the drain electrode 215b. The planarization layer 140 removes steps formed by the thin film transistor 210 and prevents defects in the display element 310 due to an uneven surface. The planarization layer 140 may be have a single layer or include multiple layers formed of an organic material. The organic material may be a general polymer such as polymethylmethacrylate (PMMA) or polystyrene (PS), a polymer derivative having a phenolic group, an acrylic polymer, an imide polymer, an aryl ether polymer, an amide polymer, a fluorine polymer, a p-xylene polymer, a vinyl alcohol polymer, or a blend thereof. Furthermore, the planarization layer 140 may be formed of a composite stacked body of an inorganic insulating layer and an organic insulating layer.

According to an embodiment, the display element 310 is formed on the planarization layer 140. The display element 310 may be, for example, an organic light-emitting diode that includes a first electrode 311, a second electrode 315 facing the first electrode 311, and an intermediate layer 313 between the first electrode 311 and the second electrode 315.

According to an embodiment, the first electrode 311 is formed on the planarization layer 140, and is electrically connected to the thin film transistor 210. The first electrode 311 may have various forms, such as an island form patterned by a photolithography method.

According to an embodiment, first electrode 311 is a reflective electrode. For example, the first electrode 311 includes a reflective film formed of one of Ag, Mg, Al, Pt, Pd, Au, Ni, Nd, Ir, or Cr, or a compound thereof, and a transparent or semi-transparent electrode layer formed on the reflective film. The transparent or semi-transparent electrode layer includes at least one of an indium tin oxide (ITO), an indium zinc oxide (IZO), an indium tin zinc oxide (ITZO), a gallium zinc oxide (GZO), or an indium gallium zinc oxide (IGZO).

For example, according to an embodiment, the first electrode 311 has a stack structure of a first transparent or semi-transparent electrode layer, a second conductive layer that includes silver, and a third transparent or semi-transparent electrode layer. Furthermore, the second conductive layer that includes silver may further include an alloy element whose atomic radius is less than or equal to an atomic radius of silver, to prevent silver coagulation. The alloy element includes at least one of zinc (Zn), nickel (Ni), cobalt (Co), copper (Cu), gallium (Ga), germanium (Ge), platinum (Pt), antimony (Sb), manganese (Mn), tungsten (W), or molybdenum (Mo).

According to an embodiment, the second electrode 315 is a transparent or semi-transparent electrode, and is formed as a metallic thin film that has a small work function and that includes Li, Ca, LiF/Ca, LiF/Al, Al, Ag, Mg, or a compound thereof. Furthermore, an auxiliary electrode layer or a bus electrode may be further formed on the metal thin film with a transparent electrode material, such as ITO, IZO, ZnO, or $In_2O_3$. Accordingly, the second electrode 315 transmits light emitted from an organic emission layer included in the intermediate layer 313. In other words, the light emitted from the organic emission layer is emitted toward the second electrode 315 directly or is reflected by the reflective first electrode 311.

However, the display device 10 according to a present embodiment is not limited to a top emission type, and may be a bottom emission type in which the light emitted from the organic emission layer is emitted toward the substrate 100. In this case, the first electrode 311 includes a transparent or semi-transparent electrode, and the second electrode 315 includes a reflective electrode. Furthermore, the display device 10 according to a present embodiment is a dual emission type in which light is emitted in two directions from a front surface and a rear surface.

According to an embodiment, the pixel defining layer 150 is an insulator on the first electrode 311. The pixel defining layer 150 is formed by a method, such as spin coating, that uses at least one organic insulating material selected from polyimide, polyamide, acrylic resin, benzocyclobutene, or phenol resin. The pixel defining layer 150 exposes an area of the first electrode 311, and the intermediate layer 313 that includes the organic emission layer is disposed in the exposed area. In other words, the pixel defining layer 150 delimits a pixel area of the organic light-emitting diode.

According to an embodiment, the organic emission layer included in the intermediate layer 313 includes a low molecular organic material or a polymer organic material, and the intermediate layer 313 further and selectively includes, in addition to the organic emission layer, functional layers such as a hole transport layer (HTL), a hole injection layer (HIL), an electron transport layer (ETL), and an electron injection layer (EIL).

Figure 3:
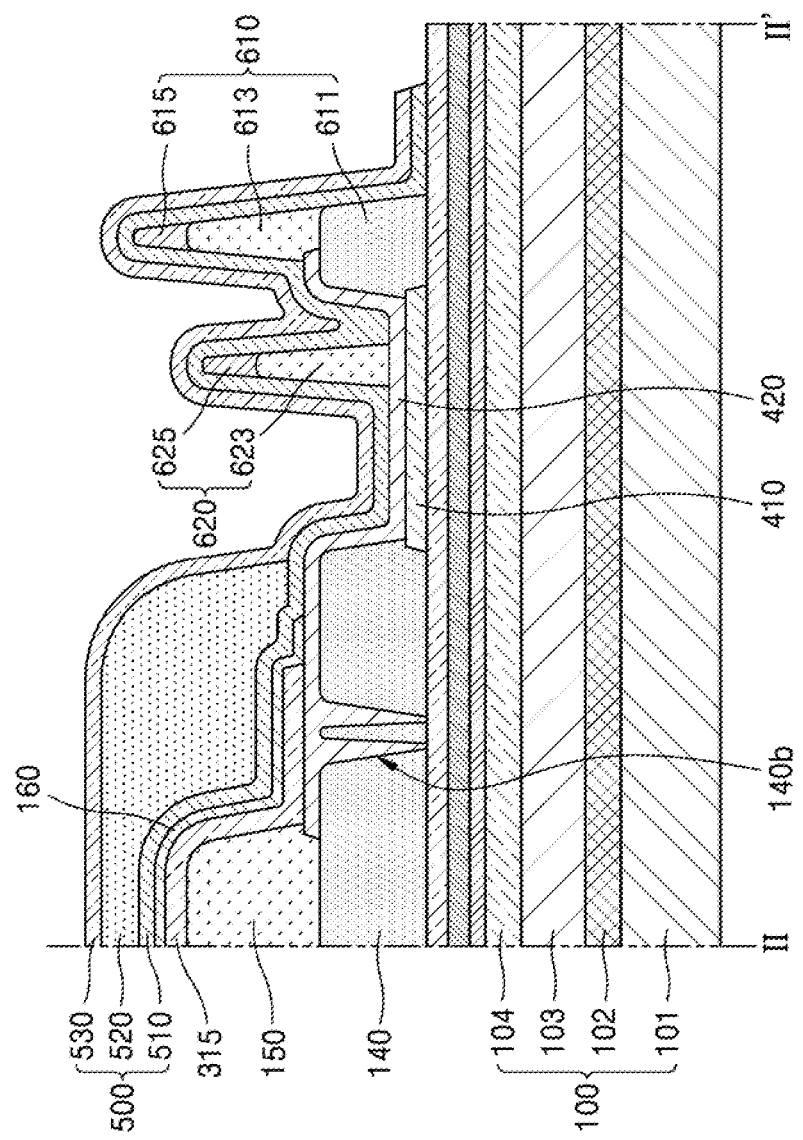
FIG. 3 is a cross-sectional view taken along line II-II' of FIG. 1.

FIG. 3 is a cross-sectional view taken along line II-II' of FIG. 1. The configuration of the substrate 100, particularly the peripheral area PA of FIG. 1 and an encapsulation layer 500 disposed on the display layer 300 of FIG. 2, which are not described in FIG. 2, are described in detail with reference to FIG. 3.

First, according to an embodiment, the substrate 100 includes a first substrate 101, a first inorganic layer 102, a second substrate 103, and a second inorganic layer 104, which are sequentially stacked.

According to an embodiment, the first substrate 101 and the second substrate 103 are formed of a transparent glass material whose primary ingredient is, for example, SiO2. However, the first substrate 101 and the second substrate 103 are not limited thereto, and may be formed of a transparent plastic material. The plastic material may be polyethersulphone (PES), polyacrylate (PAR), polyetherimide (PEI), polyethyelenen naphthalate (PEN), polyethyelenetereptha-late (PET), polyphenylene sulfide (PPS), polyallylate, polyimide, polycarbonate (PC), cellulose triacetate (TAC), or cellulose acetate propionate (CAP).

According to an embodiment, the first substrate 101 and the second substrate 103 may have the same or different thickness. For example, each of the first substrate 101 and the second substrate 103 includes polyimide and has a thickness from about 3 μm to about 20 μm.

According to an embodiment, the first inorganic layer 102 and the second inorganic layer 104 function as barrier layers that prevent intrusion of external foreign materials, may include a single layer or multiple layers that include an inorganic material such as a silicon nitride (SiNx) or a silicon oxide (SiOx). Each of the first inorganic layer 102 and the second inorganic layer 104 has a thickness from about 4000 Å to about 7000 Å, but embodiments of the present disclosure are not limited thereto.

According to an embodiment, the display device 10 of FIG. 1 includes an encapsulation layer 500 that protects the display element 310 from external moisture or oxygen, by covering the display layer 300 of FIG. 2. An electrode power supply line 410 electrically connected to the second electrode 315 is disposed in the peripheral area PA of FIG. 1.

According to an embodiment, the electrode power supply line 410 is simultaneously formed with the other conductive layers of the display area AA and from the same material as the other conductive layers of the display area AA. For example, the electrode power supply line 410 is formed together with the source and drain electrodes 215a, 215b of FIG. 2, and is disposed on the interlayer insulating layer 131. However, embodiments of the present disclosure are not limited thereto, and various modifications are possible. For example, the electrode power supply line 410 can be simultaneously formed with the gate electrode 213 on the gate insulating layer 121 from the same material as the gate electrode 213.

According to an embodiment, the electrode power supply line 410 may be directly connected to the second electrode 315, or may be electrically connected to the second electrode 315 via a protective conductive layer 420 disposed on the planarization layer 140, as illustrated in FIG. 3. In other words, the protective conductive layer 420 extends over the electrode power supply line 410 to be electrically connected to the electrode power supply line 410. The protective conductive layer 420 is simultaneously formed with the first electrode on the planarization layer 140 311 from the same material as the first electrode 311.

According to an embodiment, to prevent foreign materials, such as oxygen or moisture, from leaking through the planarization layer 140 into the display area AA, the planarization layer 140 has an opening 140b in the peripheral area PA, as illustrated in FIG. 3. Furthermore, when the protective conductive layer 420 is formed, the protective conductive layer 420 fills the opening 140b. Accordingly, foreign materials that would otherwise leak into the planarization layer 140 in the peripheral area PA can be effectively prevented from doing so.

According to an embodiment, the opening 140b of the planarization layer 140 can have various shapes. For example, the opening 140b in the planarization layer 140 is a channel that continuously surrounds the display area AA along an edge of the display area AA outside the display area AA. The opening 140b may include a plurality of channels 140b that continuously surround the display area AA.

According to an embodiment, a capping layer 160 that improves the efficiency of light generated by the organic light-emitting diode is disposed on the second electrode 315. The capping layer 160 covers the second electrode 315, and extends out from the second electrode 315 such that an end portion of the capping layer 160 is disposed on the planarization layer 140. The capping layer 160 includes an organic material.

According to an embodiment, the encapsulation layer 500 is disposed on the capping layer 160. The encapsulation layer 500 protects the organic light-emitting diode from moisture or oxygen. To this end, the encapsulation layer 500 extends not only over the display area AA where the organic light-emitting diode is located, but also over the peripheral area PA outside the display area AA. The encapsulation layer 500 has a multilayer structure, as illustrated in FIG. 3. In detail, the encapsulation layer 500 include a first inorganic encapsulation layer 510, an organic encapsulation layer 520, and a second inorganic encapsulation layer 530, which are sequentially stacked.

According to an embodiment, the first inorganic encapsulation layer 510 covers the capping layer 160, and includes a silicon oxide, a silicon nitride, or a silicon oxynitride. The first inorganic encapsulation layer 510 is formed along the underlying structure.

According to an embodiment, the organic encapsulation layer 520 covers the first inorganic encapsulation layer 510 and has a thickness sufficient to substantially planarize the upper surface of the organic encapsulation layer 520. The organic encapsulation layer 520 includes at least one of polyethylene terephthalate, polyethylene naphthalate, polycarbonate, polyimide, polyethylene sulfonate, polyoxymethylene, polyarylate, or hexamethyldisiloxane.

According to an embodiment, the second inorganic encapsulation layer 530 covers the organic encapsulation layer 520, and includes a silicon oxide, a silicon nitride, or a silicon oxynitride. The first inorganic encapsulation layer 510 and the second inorganic encapsulation layer 530 each have an area greater than the organic encapsulation layer 520, and contact each other outside the organic encapsulation layer 520. In other words, the first inorganic encapsulation layer 510 and the second inorganic encapsulation layer 530 prevent the organic encapsulation layer 520 from being externally exposed.

As such, according to an embodiment, since the encapsulation layer 500 has a multilayer structure of the first inorganic encapsulation layer 510, the organic encapsulation layer 520, and the second inorganic encapsulation layer 530, even when a crack is generated in the encapsulation layer 500, the crack may not extend into the first inorganic encapsulation layer 510 or the second inorganic encapsulation layer 530. Accordingly, formation of a route by which external moisture or oxygen can leak into the display area AA can be prevented or reduced.

According to an embodiment, in a process of forming the encapsulation layer 500 as above, structures thereunder can be damaged. For example, if the first inorganic encapsulation layer 510 is formed by a chemical vapor deposition method, a layer directly under the first inorganic encapsulation layer 510 can be damaged. Accordingly, when the first inorganic encapsulation layer 510 is directly formed on the capping layer 160, the capping layer 160 can be damaged, which can degrade the light efficiency of the display device. Accordingly, to prevent the capping layer 160 from being damaged when forming the encapsulation layer 500, a protective layer is disposed between the capping layer 160 and the encapsulation layer 500. The protective layer includes LiF.

In detail, according to an embodiment, when the encapsulation layer 500 is formed, a material for forming the organic encapsulation layer 520 is limited to be located in a preset area. To this end, as illustrated in FIG. 3, a first dam 610 is disposed in the peripheral area PA, spaced apart from the planarization layer 140.

According to an embodiment, the first dam 610 has a multilayer structure. For example, the first dam 610 has a structure in which a first layer 611, a second layer 613, and a third layer 615 are sequentially stacked. The first layer 611 is simultaneously formed with the planarization layer 140 from the same material as the planarization layer 140, and the second layer 613 is simultaneously formed with the pixel defining layer 150 from the same material as the pixel defining layer 150. The third layer 615 may be additionally formed of the same material as the second layer 613 on the second layer 613.

According to an embodiment, the first dam 610 supports masks used in a manufacturing process to form the intermediate layer 313 or the second electrode 315 of the organic light-emitting diode, or to form the capping layer 160. In the process, the first dam 610 prevents constituent elements formed in advance from contacting and damaging the mask. Furthermore, the first dam 610 prevents the material for forming the organic encapsulation layer 520 from flowing toward the edge of the substrate 100 when forming the organic encapsulation layer 520 on the first inorganic encapsulation layer 510. Furthermore, since the first dam 610 is spaced apart from the planarization layer 140, external moisture can be prevented from leaking into the display area AA along the planarization layer 140.

According to an embodiment, the first inorganic encapsulation layer 510 and the second inorganic encapsulation layer 530, as illustrated in FIG. 3, extend to the outer side of the first dam 610 by covering the first dam 610, thereby further effectively preventing leakage of external moisture and oxygen.

According to an embodiment, a second dam 620 is further formed on the inside of the first dam 610. The second dam 620 is disposed on the protective conductive layer 420 that is on the electrode power supply line 410. The second dam 620 includes a lower layer 623 that is simultaneously formed with the second layer 613 of the first dam 610 from the same material as the second layer 613, and an upper layer 625 disposed on the lower layer 623 and formed from the same material as the third layer 615 of the first dam 610, and has a height lower than that of the first dam 610.

Figure 4:
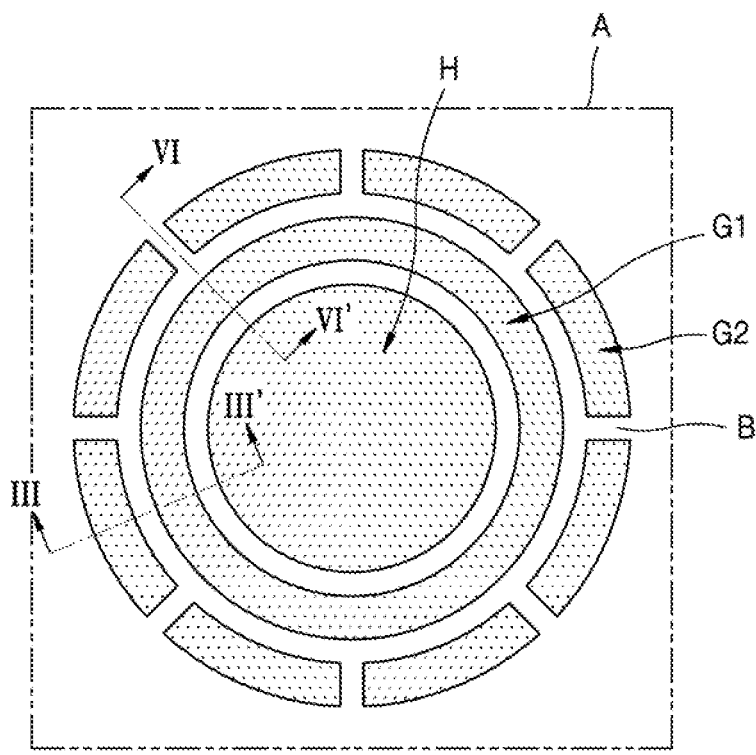
FIG. 4 is an enlarged schematic plan view of a portion A of FIG. 1.
Figure 5:
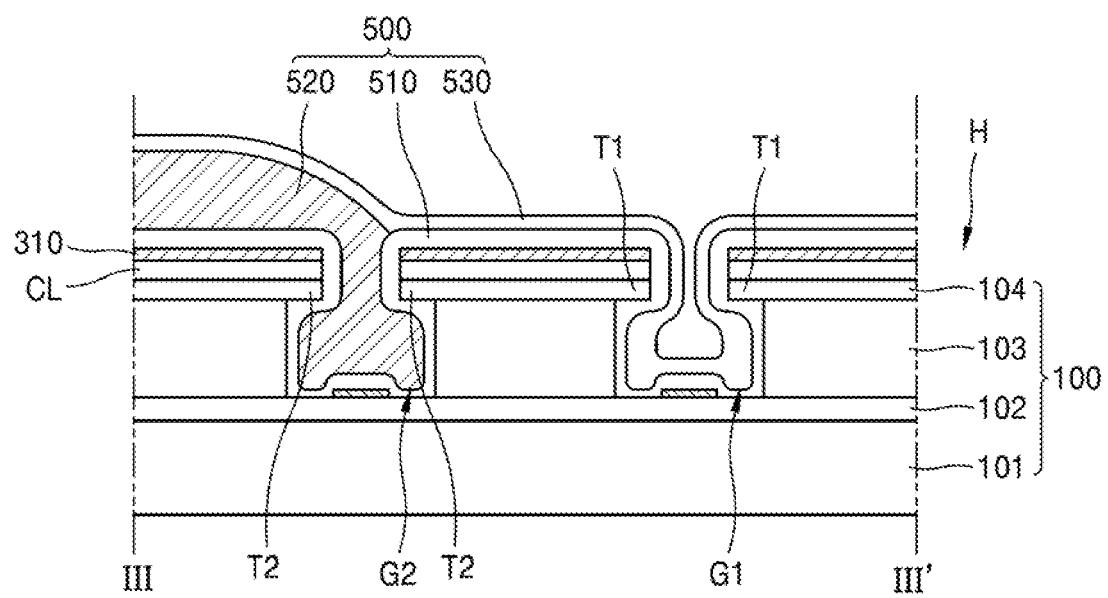
FIG. 5 is a cross-sectional view taken along line III-III' of FIG. 4.
Figure 6:
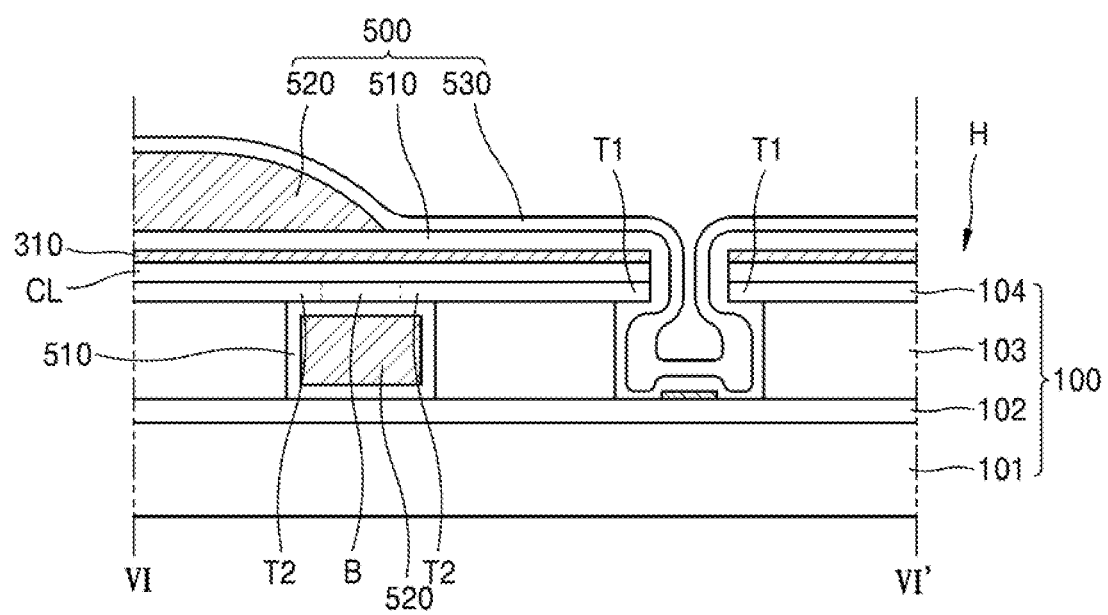
FIG. 6 is a cross-sectional view taken along line IV-IV' of FIG. 4.
Figure 7:
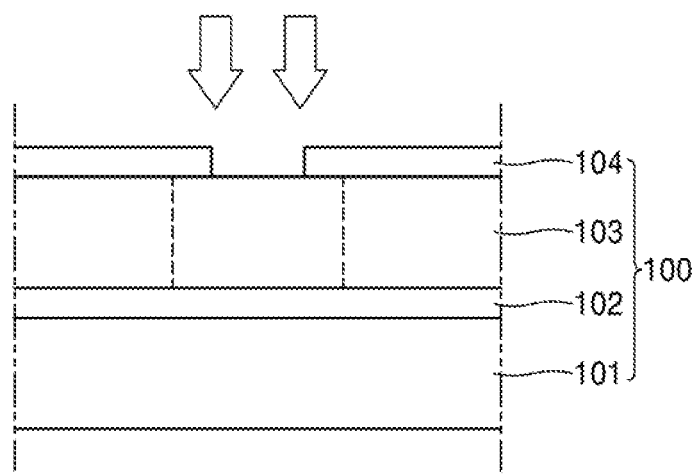
FIG. 7 is a cross-sectional view that illustrates a method of forming a groove of FIG. 4.
Figure 8:
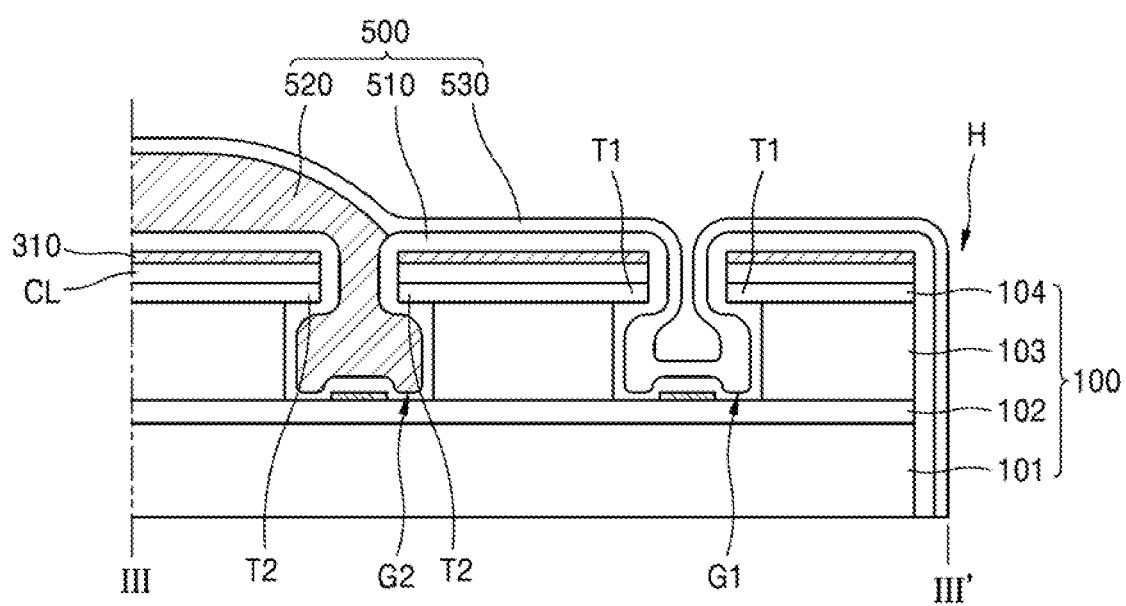
FIG. 8 is another cross-sectional view taken along line III-III' of FIG. 4.

FIG. 4 is an enlarged schematic plan view of a portion A of FIG. 1. FIG. 5 is a cross-sectional view taken along line III-III' of FIG. 4. FIG. 6 is a cross-sectional view taken along line IV-IV' of FIG. 4. FIG. 7 is a cross-sectional view that illustrates a method of forming a groove of FIG. 4. FIG. 8 is another cross-sectional view taken along line III-III' of FIG. 4.

First, according to an embodiment, referring to FIGS. 4 to 6, a hole H formed in the display area AA penetrates the substrate 100, the circuit layer CL, and the display layer 300. Furthermore, at least two grooves G1 and G2 are formed in the vicinity of the hole H and that surround the hole H. The at least two grooves G1 and G2 extend from the display layer 300 into the substrate 100. In the following description, the at least two grooves G1 and G2 are referred to as a first groove G1 and a second groove G2 according to which is closer to the hole H. In other words, a groove that is closest to the hole H is referred to as the first groove G1. Although FIG. 4 illustrates an example in which the two grooves G1 and G2 surround the hole H, embodiments of the present disclosure are not limited thereto, and three or more grooves may be formed.

According to an embodiment, the first groove G1 surrounds the hole H at a position spaced apart from the hole H. The first groove G1 has an undercut structure. For example, the first groove G1 is formed by removing parts of the second inorganic layer 104 and the second substrate 103 of the substrate 100. In this state, the second inorganic layer 104 includes a pair of first tips T1 that face each other in an open upper end portion of the first groove G1, and that extend toward each other. In other words, a width of an upper end portion of the first groove G1 is less than a width of the inside or the bottom portion of the first groove G1. The width of the first groove G1 denotes a distance measured in a direction perpendicular to a lengthwise direction of the first groove G1. For example, when the first groove G1 has a circular shape, the width of the first groove G1 is along a radial direction of the circle, perpendicular to the circumferential direction of the circle.

According to an embodiment, the pair of first tips T1 are formed by a method illustrated in FIG. 7. In detail, after an opening is formed by patterning the second inorganic layer 104, using the second inorganic layer 104 as a mask, a laser beam is irradiated toward the second substrate 103 from above the second inorganic layer 104, as indicated by the arrows in FIG. 7, to remove the second substrate 103. Alternatively, a dry etching is performed. Then, the second substrate 103 is removed so that the bottom portion of the first groove G1 is larger than the opening of the second inorganic layer 104, and the opening pattern of the second inorganic layer 104 constitutes the pair of first tips T1.

As such, according to an embodiment, when the display element 310 is formed where the pair of first tips T1 are formed, various organic layers included in the display element 310 are not formed on an inner wall surface of the first groove G1 due to the undercut structure defined by the pair of first tips T1, and the various organic layers included in the display element 310 are formed only on a partial area of the surface of the bottom of the first groove G1. Accordingly, the various organic layers included in the display layer 300 are disconnected, and thus external moisture or oxygen coming through the hole H can be prevented from leaking into the display area AA along the various organic layers in the display element 310.

According to an embodiment, the second groove G2 surrounds the first groove G1 in an area spaced apart from the first groove G1 The first and second grooves G1 and G2 may be concentric about a center of the hole H. The basic configuration of the second groove G2 is the same as that of the first groove G1. In other words, the second groove G2 has an undercut structure that includes a pair of second tips 12, and thus a width of an upper end portion of the second groove G2 is be less than a width of a lower end portion of the second groove G2. The second tips 12 of the second groove G2, unlike the first tips T1, are not completely spaced apart from each other along the entire circumferential direction of the second groove G2. In other words, while the first tips T1 are spaced apart from each other over the whole circumferential direction of the first groove G1, the second tips T2 are connected to each other by a bridge B along portions of the circumferential direction of the second groove G2.

According to an embodiment, the bridge B improves the mechanical strength of the second tips T2 by partially connecting the second tips T2. Accordingly, even when a shock is applied to the second tips T2, damage to the second tips T2 can be prevented, and thus a crack may be prevented from forming in the first inorganic encapsulation layer 510 of the encapsulation layer 500. The bridge B includes a plurality of bridges, and the bridges B are spaced apart at regular intervals or irregular intervals in the circumferential direction of the second groove G2. The bridge B is integrally formed with the second tips 12. In contrast, since the first groove G1 is located closest to the hole H, if the first tips T1 are connected by the bridge B, the display element 310 would be formed on the bridge B, and thus a continuous organic layer would be formed. Accordingly, the first tips T1 are spaced apart from each along the entire circumferential direction.

According to an embodiment, although the display element 310 is not formed on the inner wall surfaces of the first and second grooves G1 and G2 due to the undercut structures of the first and second grooves G1 and G2, as the first inorganic encapsulation layer 510 of the encapsulation layer 500 are formed to be conformal, the first inorganic encapsulation layer 510 is formed not only on the inner wall surfaces of the first groove G1 and the second groove G2, but also on the lower surfaces of the first tips T1 and the second tips T2. In other words, the first inorganic encapsulation layer 510 is continuously formed, without interruptions.

According to an embodiment, the first inorganic encapsulation layer 510 is formed on a lower surface of the bridge B, as illustrated in FIG. 6. To this end, a width of the bridge B is less than or equal to two times the length of the second tips T2. The width of the bridge B denotes a width along the circumferential direction of the second groove G2, and the length of the second tips T2 denotes a length along the radial direction of the second groove G2. Since the first inorganic encapsulation layer 510 is formed even on the lower surface of the bridge B, the first inorganic encapsulation layer 510 is prevented from being partially disconnected on the lower surface of the bridge B.

According to an embodiment, the organic encapsulation layer 520 fills the inside of the second groove G2. In other words, when the organic encapsulation layer 520 is formed, the material for forming the organic encapsulation layer 520 fills the inside of the second groove G2, and is prevented from overflowing out of the second groove G2. In other words, since the second groove G2 sections an area where the organic encapsulation layer 520 is formed, the first dam 610 can be omitted, and thus the non-display area around the hole H can be reduced.

According to an embodiment, the second inorganic encapsulation layer 530 is formed similarly to the first inorganic encapsulation layer 510. Accordingly, the second inorganic encapsulation layer 530 and the first inorganic encapsulation layer 510 contact each other in the first groove G1 that is closest to the hole H, thereby preventing intrusion of external moisture and oxygen.

According to an embodiment, the first inorganic encapsulation layer 510 and the second inorganic encapsulation layer 530, as illustrated in FIG. 8, extend to an inner wall of the hole H and contact a side surface of the substrate 100. Accordingly, the intrusion of external moisture and oxygen can be effectively prevented.

As described above, according to above-described embodiments, a plurality of grooves are formed that surround a through portion in which a separate member such as a camera is disposed, and the intrusion of external moisture through the through portion can be prevented.

Furthermore, since a pair of tip portions that face each other and form an upper end of an opening of each of a plurality of grooves are partially connected to each other by a bridge, the mechanical strength of the tip portions is improved and thus damage to an encapsulation layer can be prevented.

The scope of the present disclosure is not limited by the above effects.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. A display device, comprising:
    a substrate;

a circuit layer on the substrate;
a display element on the circuit layer, the display element including a first electrode, a second electrode and an intermediate layer between the first electrode and the second electrode;
at least one hole in a display area of the substrate that penetrates the substrate; and
at least two grooves that surround the at least one hole, each of the at least two grooves having an undercut structure,
wherein the substrate comprises
  a first substrate,
  a first inorganic layer,
  a second substrate, and
  a second inorganic layer, which are sequentially stacked, and
each of the at least two grooves extends from the second layer down into the second substrate.

2. The display device of claim 1, wherein
the at least two grooves comprise
  a first groove closest to the at least one hole and spaced apart from the at least cine hole, and
  a second groove that surrounds the first groove and is spaced apart from the first groove,
the second inorganic layer comprises a pair of first tips that extend into the first groove, wherein the pair of first tips face each other to form the undercut structure, and
the second inorganic layer comprises a pair of second tips that extend into the second groove, wherein the pair of second tips face each other to form the undercut structure.

3. The display device of claim 2, further comprising
a bridge that connects the pair of second tips to each other along portions of the second groove,
wherein the bridge is integrally formed with the pair of second tips, and the pair of first tips are spaced apart from each other along the entire first groove.

4. The display device of claim 3, further comprising
an encapsulation layer that covers the display element,
wherein the encapsulation layer comprises
  a first inorganic encapsulation layer an organic encapsulation layer, and
  a second inorganic encapsulation layer, which are sequentially stacked, and the first inorganic encapsulation layer covers bottom surfaces and inner wall surfaces of the first groove and the second groove.

5. The display device of claim 4, wherein
the first inorganic encapsulation layer covers a lower surface of the bridge.

6. The display device of claim 4, wherein
the organic encapsulation layer fills the second groove.

7. The display device of claim 4, wherein
the second inorganic encapsulation layer and the first inorganic encapsulation layer are in contact with each other in the first groove.

8. The display device of claim 1, wherein the intermediate layer comprises an organic, emission layer and at least one of a hole transport layer (HTL), a hole injection layer (HIL), an electron transport layer (ETL), and an electron injection layer(EIL).

9. The display device of claim 1, wherein
the circuit layer includes a thin film transistor, and
the display element is electrically connected to the thin film transistor.

10. The display device of claim 1, wherein the first inorganic layer is on the first substrate, the second substrate is on the first inorganic layer, and a second inorganic layer is on the second substrate.

11. A display device, comprising:
a substrate that includes a first substrate, a first inorganic layer, a second substrate, and a second inorganic layer, which are sequentially stacked;
a circuit layer on the substrate;
a display element on the circuit layer;
at least one hole in a display area of the substrate that penetrates the substrate;
a first groove and a second groove in the display area of the substrate and that surround the at least one hole, and
an encapsulation layer that covers the display element,
wherein the second groove is spaced apart from and surrounds the first groove, and
the encapsulation layer comprises an organic encapsulation layer that fills the second groove.

12. The display device of claim 11, wherein each of the first groove and the second groove extends from the second inorganic layer down into a portion of the second substrate.

13. The display device of claim 12, wherein
the encapsulation layer further includes a first inorganic encapsulation layer and a second inorganic encapsulation layer respectively disposed below and above the organic encapsulation layer, and
the first inorganic encapsulation layer and the second inorganic encapsulation layer are in contact with each other in the first groove.

14. The display device of claim 11, wherein,
the second inorganic layer includes a pair of first tips that extend into the first groove toward each other, and
the second inorganic layer comprises a pair of second tips that extend into the second groove toward each other.

15. The display device of claim 14, wherein a width of an upper portion of each of the first groove and the second groove is less than a width of a lower portion each of the first groove and the second groove.

16. The display device of claim 14, wherein
the second inorganic layer further includes a bridge that connects the second tips to each other along portions of the second groove, and
the tips are completely spaced apart o each other along the entire first groove.

17. The display device of claim 14, wherein
the second inorganic layer includes a plurality of bridges that connect the second tips to each other, and
the plurality of bridges are spaced apart from each outer at regular intervals along the second groove.

18. The display device of claim 11, wherein
the circuit layer includes a thin film transistor, and
the display element is electrically connected to the thin film transistor.

19. A display device, comprising:
a substrate that includes a first substrate, a first inorganic layer, a second substrate, and a second inorganic layer, which are sequentially stacked;
a circuit layer on the substrate;
a display element on the circuit layer;
at least one hole in a display area of the substrate that penetrates the substrate; and
a first groove and a second groove in the display area of the substrate and that surround the at least one hole, wherein,
the second inorganic layer includes a pair of first tips that extend into the first groove toward each other, and the second inorganic layer comprises a pair of second tips that extend into the second groove toward each other.

20. The display device of claim 19, wherein
each of the first groove and the second groove extends from the second inorganic layer down into a portion of the second substrate, and
the second groove is spaced apart from and surrounds the first groove.

21. The display device of claim 19, further comprising
an encapsulation layer that covers the display element, wherein the encapsulation layer includes
an organic encapsulation layer that fills the second groove,
a first inorganic encapsulation layer and a second inorganic encapsulation layer respectively disposed below and above the organic encapsulation layer, and
the first inorganic encapsulation layer and the second inorganic encapsulation layer are in contact with each other in the first groove.

* * * * *